United States Patent
Holzhauer et al.

(10) Patent No.: US 7,369,863 B2
(45) Date of Patent: May 6, 2008

(54) POSITIONAL DATA RECORDING

(75) Inventors: Thomas Holzhauer, München (DE); Markus Höhfeld, Taufkirchen (DE); Mario Ruprecht, Stausberg (DE)

(73) Assignee: Siemens Aktiengesellschaft, Munich (DE)

( * ) Notice: Subject to any disclaimer, the term of this patent is extended or adjusted under 35 U.S.C. 154(b) by 254 days.

(21) Appl. No.: 10/496,956

(22) PCT Filed: Nov. 27, 2001

(86) PCT No.: PCT/DE01/04458

§ 371 (c)(1),
(2), (4) Date: May 27, 2004

(87) PCT Pub. No.: WO03/049478

PCT Pub. Date: Jun. 12, 2003

(65) Prior Publication Data

US 2005/0020283 A1    Jan. 27, 2005

(51) Int. Cl.
*H04Q 7/20* (2006.01)

(52) U.S. Cl. .............. 455/456.5; 455/457; 455/433; 370/449

(58) Field of Classification Search ............ 455/456.1, 455/456.2, 456.3, 457, 461, 433, 432.1, 414.1, 455/412.1, 414.2, 456.5; 342/457; 370/346, 370/449, 246
See application file for complete search history.

(56) References Cited

U.S. PATENT DOCUMENTS

| | | | |
|---|---|---|---|
| 6,195,557 B1 | 2/2001 | Havinis et al. | |
| 6,311,069 B1 * | 10/2001 | Havinis et al. | 455/456.4 |
| 6,377,810 B1 * | 4/2002 | Geiger et al. | 455/456.2 |
| 6,456,854 B1 * | 9/2002 | Chern et al. | 455/457 |
| 6,687,504 B1 * | 2/2004 | Raith | 455/456.1 |
| 7,133,685 B2 * | 11/2006 | Hose et al. | 455/456.1 |
| 2002/0027523 A1 * | 3/2002 | Muramatsu et al. | 342/357.07 |

FOREIGN PATENT DOCUMENTS

| | | |
|---|---|---|
| WO | WO 98/52379 | 11/1998 |
| WO | WO 99/63780 | 12/1999 |

OTHER PUBLICATIONS

ETSI TS 123271 v4.3.0 (Oct. 2001), Digital Cellular Telecommunications System (Phase 2+)(GSM); Universal Mobile Telecommunication System (UMTS); Functional Stage 2 Description of Location Services (3GPP TS 23.271 v. 4.3.0 Release 4), 70 pages.

* cited by examiner

*Primary Examiner*—Nghi H. Ly
(74) *Attorney, Agent, or Firm*—Bell, Boyd & Lloyd LLP

(57) ABSTRACT

The invention relates to positional data recording, and in particular, to a method and system for polling the concordance of a mobile radio terminal user for the transmission of positional data to a poller. Specifically, polling data are supplemented by a specification stipulated for the poller on the basis of which it van be determined at least whether the consent of the mobile radio terminal is to be obtained for forwarding the mobile radio position data to the poller.

20 Claims, 2 Drawing Sheets

(3GPP R4)

POSITIONAL DATA RECORDING

CLAIM FOR PRIORITY

This application claims priority to International Application No. PCT/DE01/04458 which was published in the German language on Jun. 12, 2003, and filed in the German language on Nov. 27, 2001, the contents of which are hereby incorporated by reference.

TECHNICAL FIELD OF THE INVENTION

The invention relates to positional data recording, and in particular, to a method and system for polling the concordance of a mobile radio terminal user for the transmission of positional data to a poller.

BACKGROUND OF THE INVENTION

Document WO 98/52379 describes the determination of the geographical location of a mobile station in a mobile communications network. The intention is to protect the integrity of a mobile station user and to prevent the location of a mobile station becoming known against the will of the user. For this purpose an authorization check is performed in conjunction with an inquiry to determine the geographical location of a mobile station. The geographical location is only determined if authorization is present for the mobile station to be determined. Said authorization check includes verification of whether a mobile station user has given consent for the location of his mobile station to be determined. The authorization check also includes that only certain third parties are informed of the geographical location of a mobile station.

Document WO 99/63780 describes a method in a telecommunications system for administering location services by using black and gray location application lists and a position gateway. When a location application subscribes to a location service, the service provider assigns to the location application a unique location application identifier number (LAIN) which is included in every position inquiry. The black list is used to bar services to location applications included in the list, while maintaining the location application profile of the location application in a position gateway. Location applications included in the gray list have access to a service, but the latter is monitored by a network unit.

It is known from 3GPP-TS 23.271 to use positional data of a mobile radio terminal user of a cellular mobile radio network for location-based services such as information about the nearest service station, etc. ("location services"=LCS). However, in some circumstances a mobile radio terminal user would wish to prevent every third party being able to obtain his current position from the mobile radio network. The mobile radio terminal user consequently requires a function which defines for every potential poller of his position from the mobile radio network whether notification of the positional data of the mobile radio terminal user to said poller is generally permitted, generally barred, or may be permitted following verification from the mobile radio terminal user. This function is referred to as the LCS user privacy function.

The LCS user privacy defined by 3GPP (3GPP standards TS 23.271 and TS 29.002) requires a relatively large amount of memory in the home location register (HLR) of the mobile radio network and in the exchange (MSC-SGSN), and creates a high load when copying conditions relating to the transmission of positional data of a user to a poller from the HLR to the exchange currently being used by the user (visited MSC/SGSN).

According to 3GPP standards TS 23.271 and TS 29.002, the LCS user privacy is stored for every subscriber in a home location register (HLR) in a plurality of privacy classes and is downloaded from the HLR to the MSC or SGSN visited by the user, whereupon an LCS user privacy function checks whether, in the case of an inquiry about the position of the mobile radio terminal (mobile terminating location request MT-LR) from a GMLC, positional data is to be transmitted to the poller. LCS privacy classes are provided for value added services, namely the call session-related class and the call session-unrelated class. In 3GPP the user can specify for each of these two classes up to 40 LCS client IDs, and for each client ID (identities of potential pollers seeking the position of the user) can define specifications relating to how the MSCs/SGSNs visited by the user are to perform the LCS user privacy check. For example it is possible to specify that the user only receives an LCS notification (that is to say a notification that someone is inquiring about his position) or that the user receives an LCS verification (that is to say a query to obtain consent from the user before transmitting his position to a poller), as well as other possibilities. If an LCS client ID is not stored in a list specified by the user, a default behavior as stipulated by the user is executed.

SUMMARY OF THE INVENTION

The present invention enables a user of a mobile radio network to make specifications relating to inquiries about his position as simply and efficiently as possible. In one embodiment according to the invention, on the arrival of an inquiry from a poller at a positional data request gateway (GMLC), prior to forwarding the inquiry to the exchange (MSC, SGSN) of the mobile radio network currently being visited by the mobile radio terminal, the polling data is supplemented by a specification which indicates at least whether consent of the mobile radio terminal user is obtained for forwarding the mobile radio terminal position to said poller, the equipping of the positional data request gateway GMLC of the mobile radio network with a file that can be modified by the user is enabled, which file indicates for any inquiries whether consent is obtained before positional data is transmitted, and optionally at what time and/or for which positions transmission of positional data to the poller is permitted by the user. An increased load as a result of downloading such specifications from the home location register into an exchange MSC/SGSN can consequently be substantially reduced because it is only necessary for virtual identities in the form of a limited number of specifications to be notified to an MSC by the HLR, whether the user is consulted before transmission of his positional data, and what should happen if he does not respond to this. According to one aspect according to the invention, the specifications in the positional data request gateway (POSITIONAL DATA REQUEST GATEWAY) relating to whether a user is consulted before transmission of his positional data and what should be done if he does not respond, or if he is to be notified, or whether positional data information can be passed to the poller without notification and verification, can be changed by the user simply by means of mobile radio (voice or SMS, etc.) or WAP or Internet etc., and can be linked to additional conditions (attributes, such as time-dependent or location-dependent ones), which was not possible with hitherto customary storing in the HLR.

BRIEF DESCRIPTION OF THE DRAWINGS

Further features and advantages of the invention emerge from the description of exemplary embodiments below with reference to the drawings, in which.

DETAILED DESCRIPTION OF THE INVENTION

Figure 1:
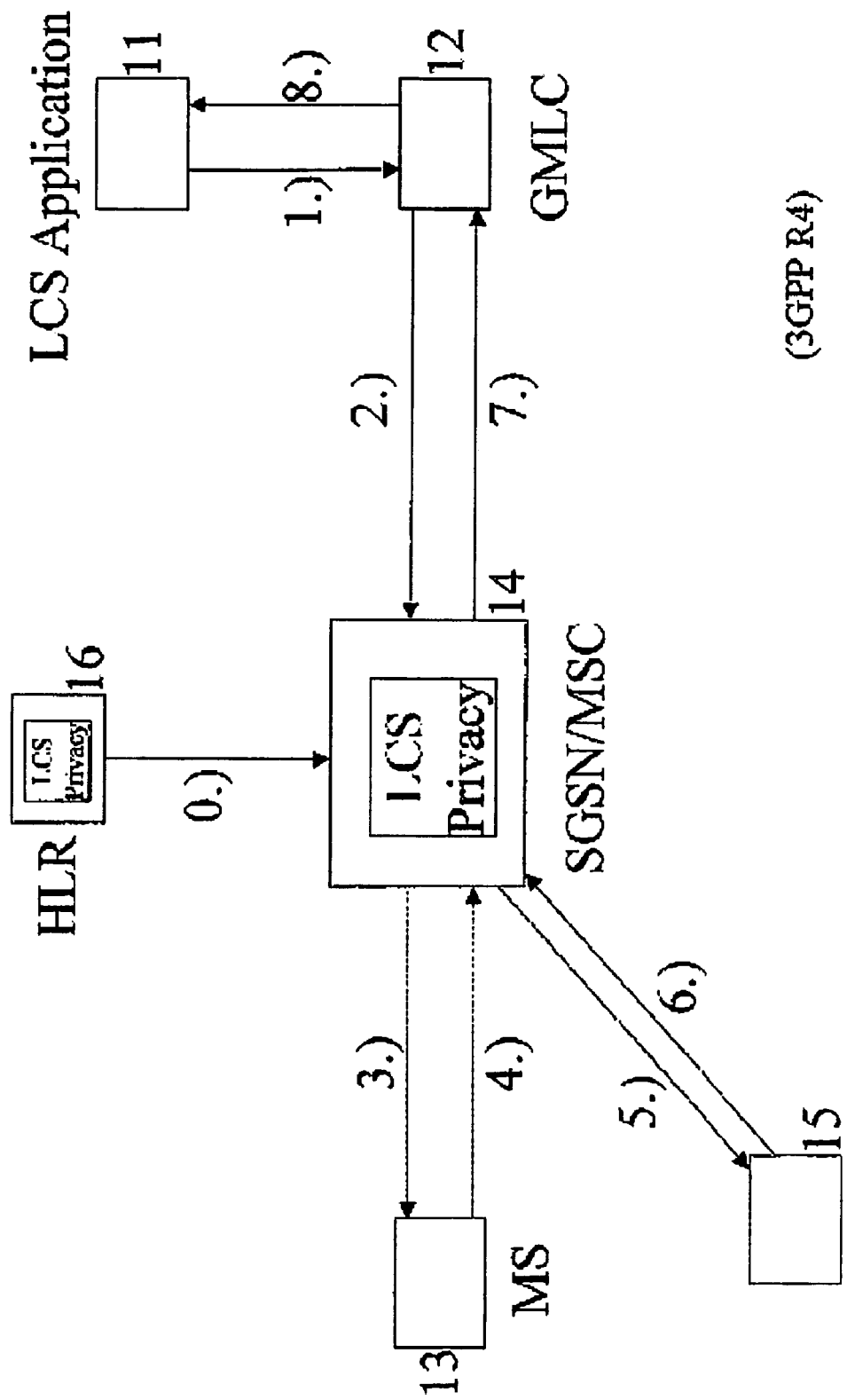
FIG. 1 shows a positional data poll according to 3GPP R4.

In FIG. 1, an inquiry 1 is sent from a positional data application (LCS application) 11 to a positional data request gateway (GMLC) 12, which in step 2 forwards the positional data inquiry to an exchange (SGSN/MSC etc.) 14 currently visited by the user of the mobile radio terminal (MS) 13. The exchange SGSN/MSC 14 has (e.g. regularly) stored in a step 0 specifications downloaded from an HLR about mobile radio terminal users which stipulate whether it is necessary to check back with the mobile radio terminal 13 before transmitting the position of the mobile radio terminal to the poller 11. If such a verification is prescribed, in step 3 the exchange 14 interrogates the mobile radio terminal 13 as to whether the user of the mobile radio terminal 13 wishes to notify the current mobile radio terminal position to the poller 11 for the current inquiry of the poller. In reply to this, either a response 4 can be sent from the mobile radio terminal to the exchange 14, or in some circumstances no response is sent if, for example, the mobile radio terminal is not being used, is switched off or is located in a radio blackspot. If transmission of the position of the mobile radio terminal to the poller 11 is permitted, or if alternatively it is permitted after consent 4 has been sought and consent has been given, or if alternatively it is specified that the position should be transmitted if a refusal of consent is not received, the position can be transmitted from the exchange 14 to the poller 11. In step 5 the exchange 14 queries in a RAN of a 3G network or a BSS of a 2G network etc. the position of the mobile radio terminal 13 (for example on the basis of the cell identity of the mobile radio cell currently being used by the mobile radio terminal 13), and in return in step 6 receives the current mobile radio terminal position. If the position is to be transmitted to the poller 11, the transmission station 14 transmits the data representing the position to the positional data request gateway GMLC 12 in step 7; in step 8 said gateway forwards the data without further conditions to the poller 11 (if appropriate also indicating the age of the positional data, insofar as the age was determined by the positional data identification station RAN/BSS 15).

Figure 2:
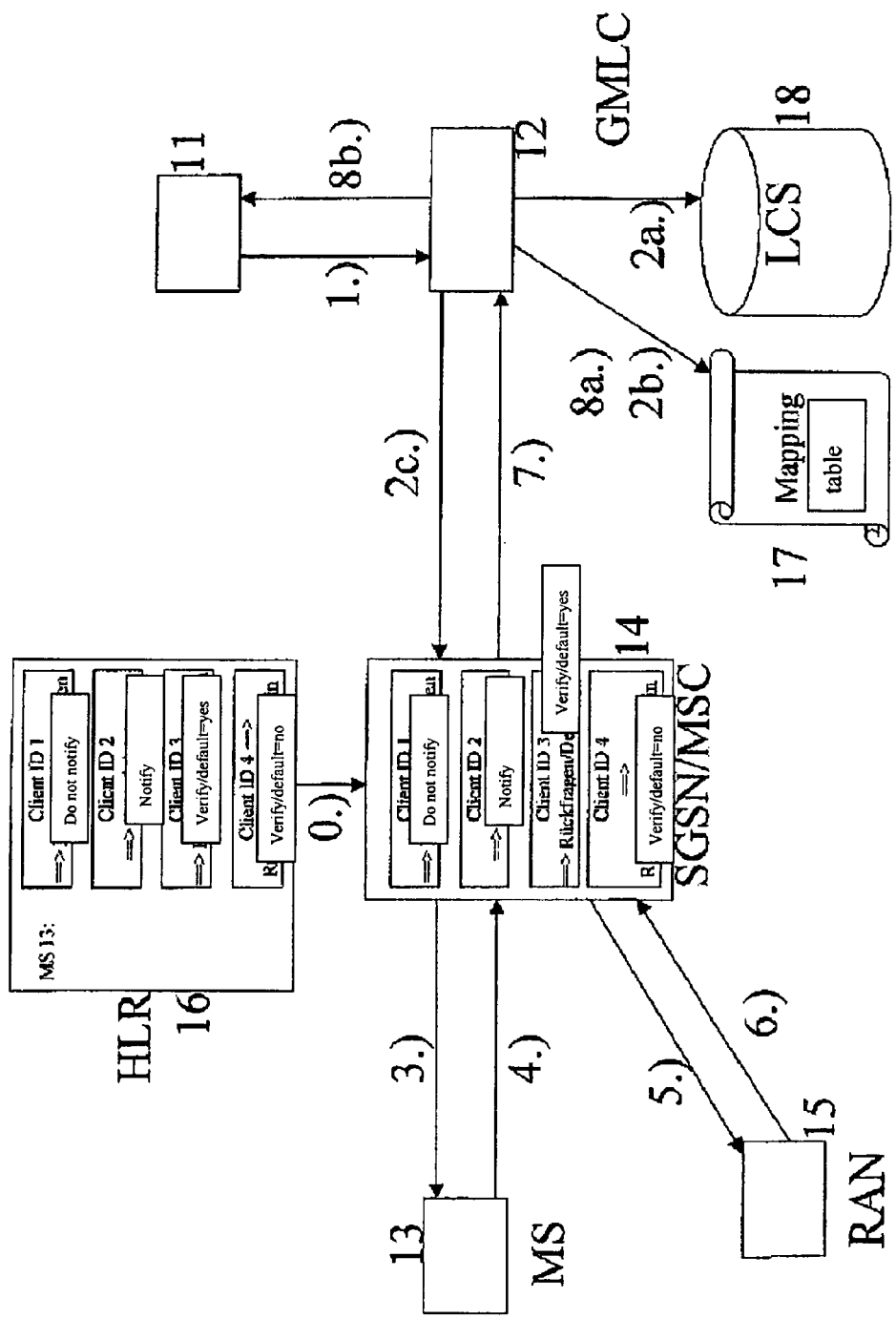
FIG. 2 shows a variation of the positional data poll according to the invention.

FIG. 2 shows a recording of the position according to the invention and forwarding to the poller in accordance with the conditions stipulated by the mobile radio terminal user:

It is possible to use here a mobile radio network according to the 3GPP R 4 standard without infringing the standard, so that upward compatibility is possible to a large extent.

As also in the solution illustrated in FIG. 1, on request or regularly in step 0 for a multiplicity of mobile radio terminal users, a set of specifications is transmitted from a home location register of the mobile radio network HLR 16 to (on request) the exchange SGSN/MSC 14 currently used by the mobile radio terminal user or (in the case of regular transmission) to the exchanges, which specifications however in this case indicate which instructions relating to queries to obtain consent are to be executed in the mobile station 13 by the exchange 14 for which of the (here virtual) poller identity data notified to the exchange 14 in inquiries relating to the position. According to the invention, this is a limited number of specifications (for a limited number of virtual identities), in the present example shown in FIG. 4 it is 4 specifications for 4 (virtual) identities. Since the specifications 20, 21, 22, 23 can be the same for a multiplicity of users of mobile radio terminals, because they do not include decisions of the users about specific pollers, but general instructions for 4 different cases, the network load between HLR 16 and exchange MSC/SGSN 14 can be substantially reduced. Moreover, the number of specifications here is very low in comparison with the possible number of up to 80 specifications (for up to 80 different pollers) per mobile station according to the 3GPP standard, which further substantially reduces the network load traffic between HLR and exchange 14.

In the present example 5 different cases are provided, with storage being required in the exchange 14 only for 4 different cases: This is possible because, prior to forwarding inquiries of a poller 11 to the exchange 14, the positional data request gateway GMLC 12 substitutes in the polling data of the inquiry, at the position at which the identify of the poller 11 is usually present, a virtual identity 20, 21, 22 or 23 in accordance with tables 18 stored in the positional data request gateway GMLC 12 or available to the latter, in which tables it is specified for each user of a mobile station 13 (or for its MSISDN, IMSI, etc.) how to respond to each poller 11. As a result, instead of the identity of the poller 11, a virtual identity 20 to 23 arrives at the exchange 14, for which identity instructions were or will be loaded from the home location register HLR 16 into the exchange 14, and in accordance with the instructions in the standard way either an inquiry is sent to the mobile station 13 to obtain consent to transmit its position to the poller 11 or not, and a default specification is provided for the case where no response is obtained.

The identity of the poller is transmitted in the positional data request gateway GMLC 12 by one of the 5 following (virtual) identities (which now only represent the instructions and no longer the identity of the poller 11) to the exchange 14:

Client ID 1: (virtual identity 1) notify positional data without notifying the mobile station 13 (which means that in the event of an inquiry the position of the mobile station 13 will be transmitted to the poller 11 without notifying the mobile station 13);

Client ID 2 (virtual identity 2): notify (which means that in the event of an inquiry from the poller 11, the latter will be transmitted the position of the mobile station 13, but the mobile station 13 will be informed of this);

Client ID 3 (virtual identity 3): in accordance with an instruction that the mobile station 13 is to be asked whether the position of the mobile station 13 is to be transmitted to the poller 11, whereby the position is transmitted to the poller 11 if the mobile station either responds positively or does not respond at all (because it is switched off, etc.).

Client ID 4 (virtual identity 4): instruction to the exchange 14 to the effect that, prior to transmitting to the poller 11 the position of the mobile station 13, the latter is asked for consent, and the position of the mobile station 13 is only transmitted if a response 4 comes from the mobile station 13 and if that response is positive.

For the fifth possibility, namely that positional data recording for the mobile station 13 is never permitted for the poller 11, nothing need be stored in the home location register 16 and in the exchange 14 because in this case the positional data request gateway GMLC 12 can notify the rejection of positional data recording to the poller 11 without verification from the exchange 14.

During the notification of the mobile station 13 and during the request for consent to transmit the positional data in the mobile station 13 in step 3, the latter is notified, for example (as standard), the name of the poller 11, so that the user of the mobile station 13 knows who is sending the inquiry.

The allocation of the specifications 20 to 23 (=virtual identities which reference only instructions) is thus known to the HLR 16 (which notifies it to the exchange 14 visited by the mobile station 13), and to the positional data request gateway GMLC 12. If a positional data request gateway GMLC 12 receives an inquiry 1 of a poller 11, prior to forwarding 2c, virtual identity data 20 or 21 or 22 or 23 is substituted for the received identity data (client ID) of the poller 11 on the basis of an allocation table (mapping table) 17 containing the mappings of identity data to the virtual identities 20 to 23 specified by the user of the mobile station 13. If necessary, the table can be supplemented by extended attributes, such as temporal or geographical restrictions or dependencies on expanded specifications about or from the poller 11.

The above method according to the invention can be implemented easily and efficiently without conflicting with the 3GPP standard.

Alternatively, the following method can be used: The specifications 20 to 23 (virtual identities client ID 1 to 4) are also stored as above in the HLR 16 and in a positional data request gateway GMLC 12.

Before this alternative method (=method II) is applied, it is checked by the positional data request gateway GMLC 12 whether the exchange MSC/SGSN 14 is able to used method II. This can be the case in particular if the exchange MSC/SGSN 14 is located in the same network as the positional data request gateway GMLC 12 or in a network comparable with the positional data request gateway GMLC 12 or is stored in a special list. If this is the case, in step 2c in FIG. 2 the identity (LCS client ID) of the poller 11 co-transmitted from the poller 11 in the inquiry in step 1 is transmitted from the positional data request gateway GMLC 12 with the position inquiry to the exchange SGSN/MSC 14 in an "extension container" (extension container according to 3GPP standard TS 29.002) or in an extension container in the "LCS client external ID" or in the "LCS client dialed by MS" etc. The exchange SGSN/MSC 14 executes the checks as described above, but before transmitting the notification or inquiry to obtain consent to the mobile station it checks whether the positional data request gateway GMLC 12 supports method II. If method II is supported by the positional data request gateway GMLC 12, prior to the inquiry 3 in the mobile station 13 with respect to consent or notification, the exchange SGSN/MSC 14 substitutes the actual LCS client ID of the poller 11 transmitted in the extension container for the specification 20/21/22/23 (virtual identity) in the polling data. Where the actual LCS client ID of the poller 11 is to be found can be provided or notified in individual cases.

The procedure according to the invention of the first method above can thus be as follows:

In step 0 a list of instructions 20 to 23 for particular inquiries is transmitted on request or regularly from the home location register HLR 16 to the exchange SGSN/MSC 14 for each mobile station 13, wherein in the instructions 20 to 23 the poller identities client ID1 to client ID4 are only virtual identities for referencing the associated instructions.

Step 1: Transmission of an LCS service request from an LCS client (inquiries of 11) to a positional data request gateway GMLC 12 and the transmission of required and optional data (client ID, IMSI/MSISDN, QoS) for this purpose.

Step 2a: The positional data request gateway GMLC 12 checks which specification 20 to 23 is to be transmitted in step 2c instead of the identity of the poller 11 in the inquiry 1 (client ID) for the poller (client ID) specified in the inquiry 1 and for the mobile radio subscriber identity module of the mobile station 13 (IMSI/MSISDN) defined in the inquiry 1 to the exchange MSC/SGSN 14. Prior to the inquiry 2C it can be checked here at what times or, after the response 7, in what region the user of the mobile station 13 has permitted for a specific user (with IMSI/MSISDN etc. according to the inquiry 1) and for a special poller 11 (according to the client ID in the inquiry 1) polling of the positional data with or without verification 3, and if appropriate the method with steps 2c to 7 is continued only in the positive case, and otherwise a rejection of the position inquiry is transmitted in step 8.

Step 2b: The identity (client ID) of the poller 11 transmitted in inquiry 1 is stored together with a transaction identity (MAP reference) allocated to the inquiry 2c in an allocation table (mapping table 17) in order to be able to allocate a response 7 containing the same transaction identity as the forwarding 2c to the poller 11 again.

Step 2c: An inquiry with a specification 20 or 21 or 22 or 23 is transmitted from the positional data request gateway GMLC 12 to an exchange 14 currently being visited by the mobile station 3 (according to the HLR specification etc.). Steps 3 to 7 follow as described for FIG. 1, wherein, however, the exchange SGSN/MSC 14 from the HLR16 for the mobile station 13 specified (IMSI/MSISDN etc.) in the inquiry 1 the specifications 20 to 23 which are the same for a multiplicity of mobile stations with associated instructions (transmit positional data without notification, transmit positional data with notification to the mobile station, ask mobile station for permission before transmitting positional data and transmit if the response is positive or no response is received, ask mobile station before transmitting positional data and transmit if a positive response is received).

Step 8a: In contrast to the above method, after receiving a response 7 (comprising positional data and possibly the age of the recording and transaction identity), the positional data request gateway GMLC 12 substitutes the identity of the poller 11 for the received transaction identity on the basis of the allocation table 17 and possibly also asks for any geographical specifications of the user 13 in the specifications list 18, and in step 8b transmits the positional data (where this was permitted) or a rejection of positional data recording to the poller 11.

The geographical specifications requested, before transmission of the positional data to the poller 11, by the positional data request gateway GMLC 12 from an LCS privacy database 18 for the location determined (by the RAN/BSS 15) comprise, for example, that in the case of visits by the user of the mobile station 13 in particular groups of cell identities etc. (which the user has previously defined in some form or other) should not be performed. In addition, it can be additionally checked here whether the position should be notified to the poller 11 at the current time, wherein the position is transmitted to the poller, for example, for positional data determined during a predetermined period of time.

What is claimed is:

1. A method for polling concordance of a user of a mobile radio terminal of a mobile radio network with transmission of the user positional data to a poller, comprising:

in a case of an inquiry of a poller relating to a position of the mobile radio terminal, prior to a forwarding of polling data from the inquiry to an exchange of the mobile radio network, supplementing the polling data by a specification stipulated for the poller, on a basis of which it can be determined at least whether consent of the mobile radio terminal is to be obtained for forwarding the mobile radio terminal position to the poller;

in a case where the specification stipulates that consent is to be obtained, sending a request for declaring the consent by the exchange to the mobile radio terminal; and prior to a transmission of the position of the terminal to the poller, checking on the basis of predetermined stored conditions whether the position is to be sent to the poller.

2. The method as claimed in claim 1, wherein mobile radio subscriber identity data relating to the identity of the mobile radio subscriber identity module and included in the inquiry is transmitted to the exchange.

3. The method as claimed in claim 1, wherein the inquiry arrives at a positional data request gateway of the mobile radio network.

4. The method as claimed in claim 1, wherein the exchange is an MSC or SGSN.

5. The method as claimed in claim 1, wherein the exchange inquires about the position of the mobile radio terminal from a BSS or RAN of the mobile radio network.

6. The method as claimed in claim 1, wherein the specification includes a predetermined number of different instructions, comprising at least one of transmit positional data without notification, transmit positional data with notification, transmit positional data after obtaining consent from the mobile station or, if no response is received from the mobile station, transmit positional data if the mobile station has consented.

7. The method as claimed in claim 1, wherein the specifications are stored for a plurality of mobile radio subscriber identity modules and/or mobile stations, and/or a limited number of different specifications are stored.

8. The method as claimed in claim 1, wherein on arrival of the inquiry at the exchange, the specifications for the mobile station are requested by the exchange from a home location register.

9. The method as claimed in claim 1, wherein for a plurality of mobile radio subscriber identities it is stored in each case in a positional data request gateway for which potential pollers polling data of the inquiry is to be supplemented by which specification from a memory prior to forwarding to the exchange.

10. The method as claimed in claim 1, wherein for a plurality of mobile radio subscriber identities, in a positional data request gateway positional data is forwarded to a poller if the poller is permitted by the mobile radio subscriber identity module or mobile radio terminal for the position according to stored conditions requested by the positional data request gateway from the memory.

11. The method as claimed in claim 1, wherein positional data is transmitted to the poller if this is permitted for a time of recording of the position according to the stored conditions for the user of the mobile station or his mobile radio subscriber identity card respectively.

12. The method as claimed in claim 1, wherein the user can make changes to the conditions using his mobile radio terminal or another terminal by means of mobile radio, WAP, Internet, fixed network or other means.

13. The method as claimed in claim 1, wherein the exchange is the mobile radio exchange currently being used by the mobile radio terminal.

14. The method as claimed in claim 1, wherein name data relating to the poller is sent to the exchange.

15. The method as claimed in claim 14, wherein the name data is transmitted from the exchange to the mobile radio terminal in the request.

16. The method as claimed in claim 1, wherein, prior to being forwarded to an exchange, the specification is substituted in the polling data transmitted with the inquiry for an identity of identity data relating to the poller, and the specification is sent to the exchange instead of the identity data.

17. The method as claimed in claim 16, wherein, prior to the forwarding of polling data to the exchange, a positional data request gateway receiving the inquiry from the poller stores the identity data relating to the poller together with the specification selected by the mobile station taking the poller into account, and following the arrival of the positional data forwards the data according to stored conditions to the poller to which the identity data stored for the specification relates.

18. The method as claimed in claim 16, wherein the identity data relating to the identity of the poller is also transmitted to the exchange in a supplement.

19. The method as claimed in claim 18, wherein the identity data is transmitted to the mobile radio terminal in a request for a consent declaration.

20. A mobile radio network, comprising:

a positional data request gateway which is designed such that, following inquiries of a poller for positional data of a mobile station, the gateway transmits positional data to the poller if conditions specified for the mobile station and stored in a memory are satisfied, wherein the positional data reciuest gateway has access to the memory which stores data corresponding to at least a particular mobile station indicating if the identity of the poller is to be replaced by a specification prior to forwarding of the inquiry of the poller to an exchange;

an exchange which is designed such that in the case of inquiries for positions of the mobile radio terminal, the mobile station is asked for consent before transmitting the positional data in accordance with the identity of the poller transmitted thereto for a mobile station; and a home location register with a memory in which instructions for exchanges are stored for a plurality of identities of pollers with respect to whether the consent of the mobile station is to be requested prior to transmission of the positional data to the poller, wherein instructions stored in one or more home location registers may be the same for identities of pollers for a plurality of mobile subscriber identity modules or mobile radio terminals.

* * * * *